United States Patent
Marbell et al.

(10) Patent No.: US 9,589,916 B2
(45) Date of Patent: Mar. 7, 2017

(54) INDUCTIVELY COUPLED TRANSFORMER WITH TUNABLE IMPEDANCE MATCH NETWORK

(71) Applicant: Infineon Technologies AG, Neubiberg (DE)

(72) Inventors: Marvin Marbell, Morgan Hill, CA (US); E J Hashimoto, San Jose, CA (US); Bill Agar, Morgan Hill, CA (US)

(73) Assignee: Infineon Technologies AG, Neubiberg (DE)

( * ) Notice: Subject to any disclaimer, the term of this patent is extended or adjusted under 35 U.S.C. 154(b) by 52 days.

(21) Appl. No.: 14/618,305

(22) Filed: Feb. 10, 2015

(65) Prior Publication Data
US 2016/0233849 A1 Aug. 11, 2016

(51) Int. Cl.
*H01L 23/66* (2006.01)
*H03H 7/38* (2006.01)
(Continued)

(52) U.S. Cl.
CPC ............ *H01L 23/66* (2013.01); *H03F 1/565* (2013.01); *H03F 3/193* (2013.01); *H03H 7/38* (2013.01); *H03F 2200/534* (2013.01)

(58) Field of Classification Search
CPC ....... H03F 2200/0451; H03F 2200/537; H03F 2200/534; H03F 2200/45731;
(Continued)

(56) References Cited

U.S. PATENT DOCUMENTS 3,424,993 A * 1/1969 Clar .................. H02H 7/20
 330/298
4,306,200 A * 12/1981 Takayama ............... H03F 1/42
 330/277

(Continued)

FOREIGN PATENT DOCUMENTS

| JP | 62256526 A | 11/1987 |
| JP | 08124685 A | 5/1996 |
| KR | 1020120125811 A | 11/2012 |

OTHER PUBLICATIONS

Marbell, et al., "Transformer Input Matched Transistor", Pending U.S. Appl. No. 14/069,867, filed Nov. 1, 2013.

*Primary Examiner* — Thomas J Hiltunen
(74) *Attorney, Agent, or Firm* — Murphy, Bilak & Homiller, PLLC (57) ABSTRACT

A packaged RF power transistor includes an RF input lead, a DC gate bias lead, an RF power transistor comprising gate, source and drain terminals, and an input match network. The input match network includes a primary inductor electrically connected to the RF input lead, a secondary inductor electrically connected to the gate terminal and to the DC gate bias lead, and a tuning capacitor electrically connected to the RF input lead and physically disconnected from the gate terminal. The input match network is configured to block DC voltages between the RF input lead and the gate terminal and to propagate AC voltages in a defined frequency range from the RF input lead to the gate terminal. The tuning capacitor is configured to adjust a capacitance of the input match network based upon a variation in DC voltage applied to the RF input lead.

13 Claims, 7 Drawing Sheets

(51) Int. Cl.
*H03F 1/56* (2006.01)
*H03F 3/193* (2006.01)

(58) Field of Classification Search
CPC ..... H03F 2200/222; H03F 2203/45638; H03F 2203/45731; H03F 1/223; H03F 1/534; H03F 1/565
See application file for complete search history.

(56) References Cited

U.S. PATENT DOCUMENTS

| | | | | |
|---|---|---|---|---|
| 5,726,603 | A * | 3/1998 | Chawla | H03F 1/301 330/269 |
| 6,046,641 | A * | 4/2000 | Chawla | H03F 1/565 330/269 |
| 6,396,298 | B1 * | 5/2002 | Young | G01R 31/2621 324/762.09 |
| 6,731,175 | B1 * | 5/2004 | Chen | H03F 1/223 330/311 |
| 7,023,315 | B2 * | 4/2006 | Yeo | H01L 23/5227 257/531 |
| 7,092,691 | B2 * | 8/2006 | Bohn | H03F 1/565 455/280 |
| 7,202,734 | B1 * | 4/2007 | Raab | H03F 3/04 330/126 |
| 7,869,771 | B2 * | 1/2011 | Zolfaghari | H04B 1/0067 340/539.3 |
| 8,229,367 | B2 * | 7/2012 | Chan | H03F 1/565 327/563 |
| 8,344,808 | B2 * | 1/2013 | Samavedam | H03F 1/086 330/255 |
| 8,717,103 | B2 * | 5/2014 | Leong | H03F 1/223 330/253 |
| 8,723,602 | B2 * | 5/2014 | Chen | H03F 3/217 330/277 |
| 9,035,703 | B2 * | 5/2015 | Feng | H03F 1/223 330/302 |
| 9,048,020 | B2 * | 6/2015 | Calvillo Cortes | H01F 19/04 |
| 9,154,356 | B2 * | 10/2015 | Tasic | H03G 3/20 |
| 9,337,183 | B2 * | 5/2016 | Marbell | H01L 27/0629 |
| 2002/0105383 | A1 | 8/2002 | Cheo | |
| 2005/0231278 | A1 | 10/2005 | Blednov | |
| 2008/0246547 | A1 | 10/2008 | Blednov | |
| 2015/0116037 | A1 * | 4/2015 | Kanemaru | H03F 1/565 330/282 |
| 2015/0249437 | A1 * | 9/2015 | Morishita | H03G 3/3036 455/253.2 |
| 2016/0064140 | A1 * | 3/2016 | Cuoco | H01F 27/2823 330/124 R |

* cited by examiner

INDUCTIVELY COUPLED TRANSFORMER WITH TUNABLE IMPEDANCE MATCH NETWORK

TECHNICAL FIELD

The instant application relates to RF power transistors, and more particularly to input matching for RF power transistors.

BACKGROUND

High power RF transistors such as LDMOS (laterally diffused metal oxide semiconductor) transistors have input and output impedances significantly lower than 50 ohms (high Q impedance), yet the functioning RF circuit has to be matched to 50 ohms. To facilitate the impedance match to 50 ohms, the RF transistor is typically designed with a match circuit on the input and output of the transistor that is integrated into the packaged transistor. The match network helps reduce the Q of the packaged transistor, making it easier to match to 50 ohms. Typically the improvement in impedance can only be achieved in a narrow frequency range. In addition, the match network helps to shape the frequency response of the transistor and amplifier such that there is high gain at the desired operating frequency, and the gain is suppressed outside that frequency range.

Known techniques for packaging high power RF transistors including providing a low-pass L-C-L network to match the input of the RF transistor. This low-pass L-C-L network matches the input impedance of the transistor to a lower Q over a specific frequency range. This low-pass L-C-L network includes discrete components and electrical connectors. Typically, the low-pass L-C-L network is designed assuming a nominal reactance value that is tailored to a specific frequency range. This nominal reactance value assumes nominal component values (i.e., capacitance, inductance, and resistance) of the discrete components and electrical connectors. However, actual component values may deviate from the nominal component values due to factors such as process variation. In fact, minor variations to the component values, such as an increase in capacitance of +/−5, percent may have a substantial impact on the performance of the input impedance network. In many applications, this deviation may be significant enough such that the part is not within specifications and must be discarded. Further, this deviation can lead to lower efficiency and power output of the device. One known technique to address this issue is to test the device during manufacturing and to subsequently perform corrective measures that compensate for deviations from the nominal values. However, these techniques add additional cost and complexity and are ill-equipped to compensate for every possible deviation from the nominal values.

SUMMARY

According to an embodiment, a packaged RF power transistor is disclosed. The packaged RF power transistor includes an RF input lead, a DC gate bias lead, an RF power transistor having gate, source and drain terminals, and an input match network. The input match network includes a primary inductor electrically connected to the RF input lead, a secondary inductor electrically connected to the gate terminal and to the DC gate bias lead, and a tuning capacitor electrically connected to the RF input lead and physically disconnected from the gate terminal. The input match network is configured to block DC voltages between the RF input lead and the gate terminal and to propagate AC voltages in a defined frequency range from the RF input lead to the gate terminal. The tuning capacitor is configured to adjust a capacitance of the input match network based upon a variation in DC voltage applied to the RF input lead.

According to another embodiment, a packaged RF power transistor is disclosed. The packaged RF power transistor has an RF input lead, a DC gate bias lead, an RF power transistor having gate, source and drain terminals, and an input match network. The input match network includes a primary inductor electrically connected to the RF input lead, a secondary inductor electrically connected to the gate terminal and to the DC gate bias lead, and a tuning capacitor electrically connected to the RF input lead and physically disconnected from the gate terminal. Nominal component values of the RF power transistor and the input match network are optimized such that a maximum gain is realized at a center frequency of the defined frequency range. Actual component values of the RF power transistor and the input match network deviate from the nominal component values by a percentage. A capacitance value of the tuning capacitor is adjustable based upon a variation in DC voltage applied to the RF input lead so as to compensate for the deviation between the nominal component values and the actual component values.

According to another embodiment, a method of packaging an RF power transistor is disclosed. The method includes providing a packaged RF power transistor, having an RF input lead, a DC gate bias lead, an RF power transistor comprising gate, source and drain terminals, and an input match network. The input match network includes a transformer coupled between the RF input lead and the gate terminal configured to block DC voltages between the RF input lead and the gate terminal and to propagate AC voltages in a defined frequency range from the RF input lead to the gate terminal, and a tuning capacitor electrically connected to the RF input lead and physically disconnected from the gate terminal. The method further includes testing the packaged RF power transistor for a deviation between nominal component values of the RF power transistor and the input match network and actual component values of the RF power transistor and the input match network. The method further includes determining a DC bias to be applied to the tuning capacitor via the RF input lead that compensates for the deviation between nominal component values and actual component values.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

DETAILED DESCRIPTION

According to embodiments described herein, an RF power transistor 100 is packaged with an input match network 102 that includes a transformer 104 between an RF input lead and a gate 106 of the RF power transistor 100. The transformer 104 includes primary and secondary inductors 108, 110 that are inductively coupled but physically disconnected from one another. Thus, the transformer 104 blocks DC voltages between the RF input lead and the gate terminal 106 and propagates AC voltages in a defined frequency range from the RF input lead to the gate terminal 106.

The input match network 102 includes a tuning capacitor 112 that is electrically connected to the RF input lead and is physically disconnected from the gate terminal 106. That is, the tuning capacitor 112 is on the primary side of the transformer 104. A capacitance value of the tuning capacitor 112 can be adjusted by varying a DC bias applied to the RF input lead. Consequently, the tuning capacitor 112 can be used to adjust the capacitance of the input match network 102, which in turn can be used to adjust the electrical characteristics of the packaged device 101. Examples of these electrical characteristics include forward voltage gain (S21), input port voltage reflection coefficient (S11) and third order intermodulation (IM3).

The RF power transistor 100 and the tuning capacitor 112 operate in different DC ranges. For example, an RF power transistor 100 that is suitable for power amplification may operate at a DC voltage of 3 volts. By contrast, the tuning capacitor 112 may be operated at voltages of between 10 and 30 volts. These higher DC voltages can potentially damage the RF power transistor 100. Advantageously, because the tuning capacitor 112 is on the primary side of the transformer 104, there is no direct electrical connection between the tuning capacitor 112 and the gate 106 of the RF power transistor 100. Thus, the DC voltage that is provided to the tuning capacitor 112 is isolated from the gate 106 of the RF power transistor 100. Meanwhile, an AC signal can propagate across the input match network 102 from the RF input lead to the gate 106 of the RF power transistor 100.

Figure 1:
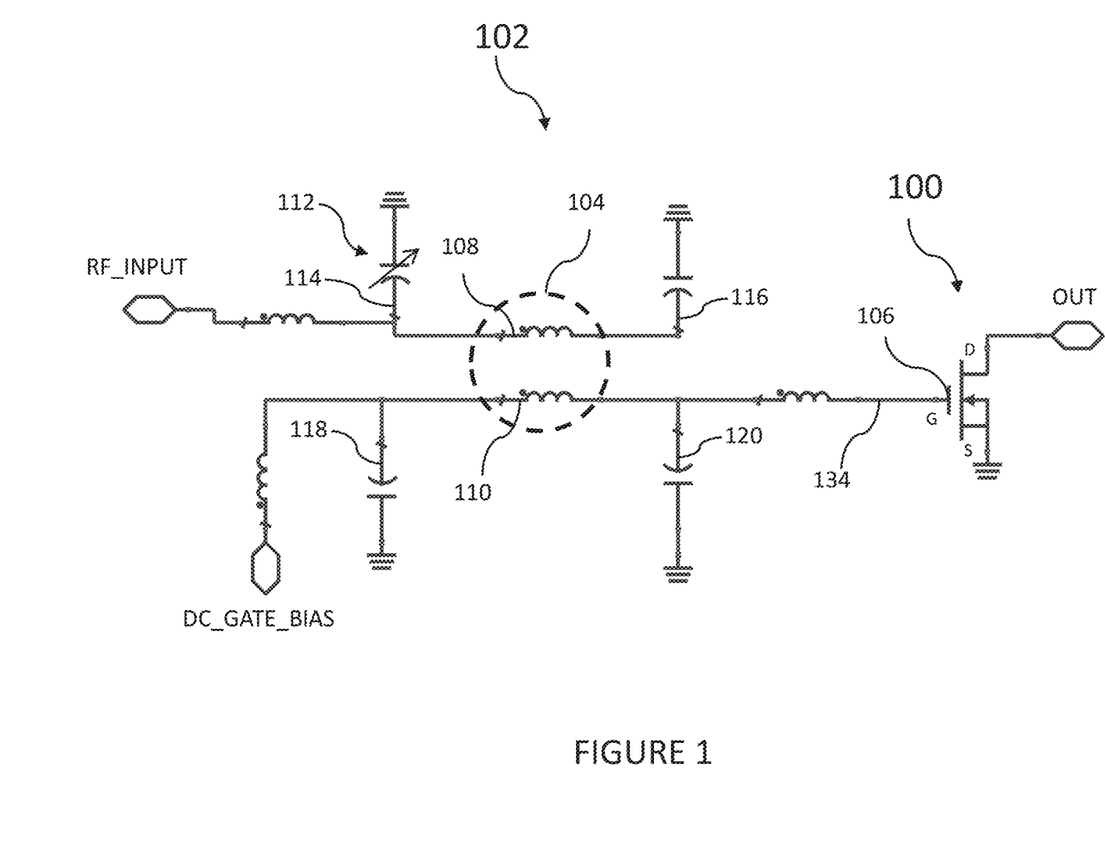
FIG. 1 illustrates an electrical schematic of a packaged RF power transistor, according to an embodiment.

Referring to FIG. 1, an electrical schematic of a packaged device 101 is depicted. The packaged device 101 includes two input terminals: an RF input lead and a DC gate bias lead. The RF input lead is electrically coupled to a gate terminal 106 of the RF power transistor 100 by an input match network 102. The DC gate bias lead is electrically connected to the gate terminal 106 of the RF power transistor 100 by the input match network 102. Additionally, the packaged device 101 includes an output terminal that is coupled to a drain terminal of the RF power transistor 100. According to an embodiment, a source terminal of the RF power transistor 100 is electrically connected to ground.

The input match network 102 is nominally configured to provide impedance matching for the RF power transistor 100 at a defined frequency range, which includes a center frequency at which gain of the device is maximized. According to an embodiment, the input match network 102 includes a primary inductor 108 electrically connected to the RF input lead and a secondary inductor 110 electrically connected to the gate terminal 106 and to the DC gate bias lead.

The primary and secondary inductors 108, 110 are inductively coupled to one another in a transformer configuration. That is, there is no physical connection between the primary and secondary inductors 108, 110. However, the primary and secondary inductors 108, 110 are in close proximity to one another such that a magnetic field generated by one induces a current in the other, and vice-versa. A more detailed explanation of an input match network 102 having a transformer configuration is provided in U.S. patent application Ser. No. 14/069,867 to Marbell, the content of which is incorporated by reference in its entirety. Due to the transformer configuration of the primary and secondary inductors 108, 110, the transformer 104 blocks DC voltages and certain low frequency AC signals from propagating from the RF input lead to the gate terminal 106 and allows higher frequency AC voltages in a defined frequency range to propagate from the RF input lead to the gate terminal 106. For example, the transformer 104 may block signals with a frequency of less than 100 megahertz (MHz) while passing AC signals in the range of 1.9-2.1 gigahertz (GHz).

The input match network 102 further includes a tuning capacitor 112 electrically connected to the RF input lead. The tuning capacitor 112 is a variable capacitor (i.e., a "varactor" or "varicap") having a capacitance value that is adjustable, based upon a DC signal that is applied to one of the terminals of the tuning capacitor 112, with the other terminal being connected to ground. The electrical connection between the tuning capacitor 112 and the RF input lead may be provided by a conductive bond wire, which is intrinsically inductive. The tuning capacitor 112 is electrically connected to the primary inductor and is physically disconnected from the gate terminal 106 of the RF power transistor 100. That is, there are no electrically conductive structures that provide a single node at which the DC voltage across the tuning capacitor 112 is always identical the DC voltage at the gate terminal 106. Thus, a DC voltage that is applied to the RF input lead and present at the ungrounded terminal of the tuning capacitor 112 is blocked from the gate terminal 106. However, any AC component of a signal that is applied to the RF input lead and present at the ungrounded terminal of the tuning capacitor 112 will pass to the gate terminal 106 via the inductive coupling the primary and secondary inductors 108, 110 in the transformer 104.

The tuning capacitor 112 is configured to adjust a capacitance of the input match network 102 based upon a variation in DC voltage applied to the RF input lead. For example, the tuning capacitor 112 can have a capacitance of 28 picofarads (pF) at a DC bias of 28 volts (V) and a capacitance of 34 picofarads (pF) at a DC bias of 15 volts. Consequently, the frequency response of the input match network 102 is adjustable.

The input match network 102 includes first and second primary side capacitors 114, 116. The primary side capacitors 114, 116 are electrically connected to the primary inductor 108. Further, the primary side capacitors 114, 116 are physically disconnected from the secondary inductor 110 as well as the gate terminal 106 of the RF transistor. In the embodiment of FIG. 1, the first primary side capacitor 114 is configured as a variable capacitor and provides the tuning capacitor 112 of the input match network 102. The input match network 102 additionally includes first and second secondary side capacitors 118, 120. The secondary side capacitors 118, 120 are electrically connected to the secondary inductor 110. Further, the secondary side capacitors 118, 120 are physically disconnected from the primary inductor 108 as well as the RF input lead.

According to an embodiment, the tuning capacitor 112 is configured to operate at a DC bias of between 0 and 40 volts. In this operating range, the tuning capacitor 112 provides the C-V characteristics of a capacitor. Further, the RF power transistor 100 is configured to operate at a DC bias of between 0 and 4 volts. In this range, the RF power transistor 100 provides the I-V characteristics of a transistor. Outside of these operating ranges, these devices are susceptible to failure and do not necessarily provide the I-V characteristics of a capacitor or transistor. For example, at gate voltages of 10 volts the RF power transistor 100 is susceptible to failure due to various high electric field phenomena, such as avalanche breakdown and dielectric breakdown. Advantageously, the transformer configuration of the input match network 102 allows the tuning capacitor 112 to be operated at the full range of 0 to 40 volts without voltages that damage the RF power transistor 100 (i.e., 4 to 40 volts) being applied to the RF power transistor 100.

Figure 2:
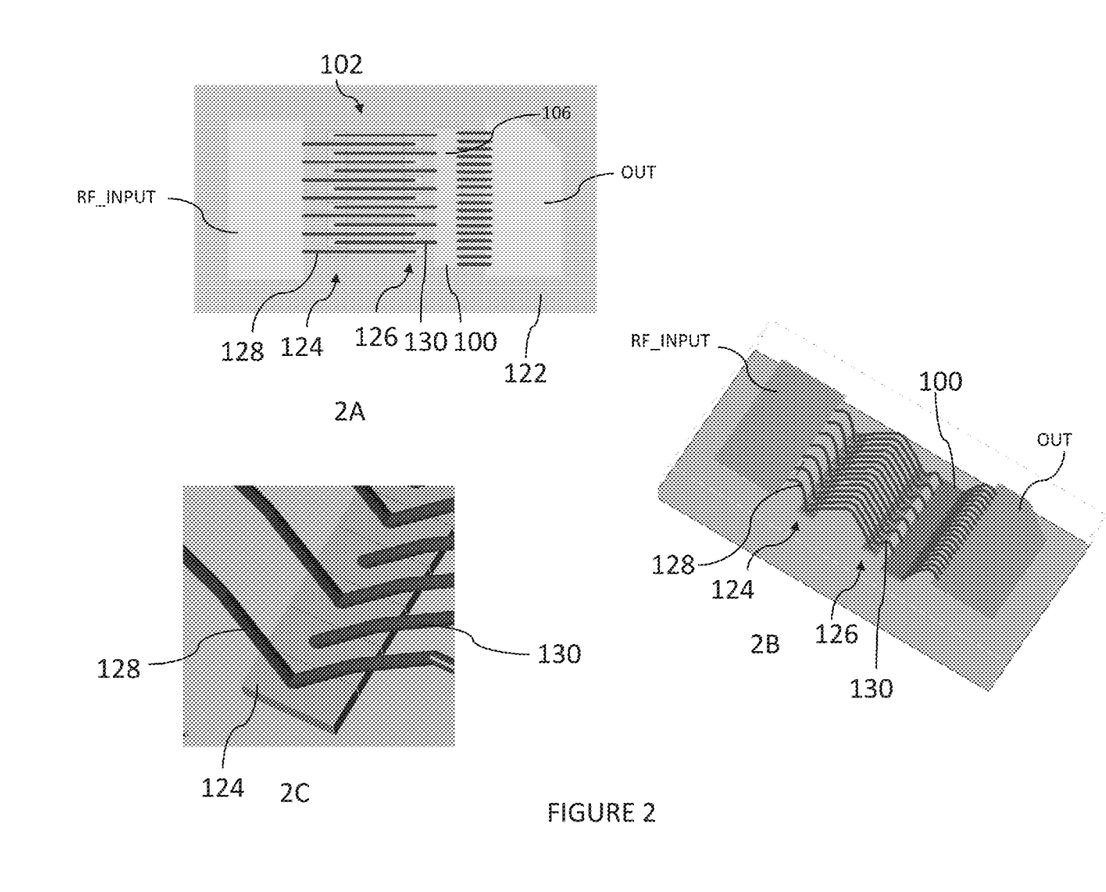
FIG. 2 illustrates a physical configuration of a packaged RF power transistor, according to an embodiment.

FIG. 2 depicts a structural configuration of the packaged device 101, according to one embodiment. FIG. 2A depicts a top down view of the packaged device 101, FIG. 2B depicts a diagonal view of the packaged device 101, and FIG. 2C depicts a close up view of bond wires and a segmented capacitor array 124 in the packaged device 101.

The package of the packaged device 101 includes an electrically conductive substrate 122 that provides a ground terminal for the packaged device 101. Each of the components that are mounted on the package has a surface terminal that can be grounded via an electrical connection to the substrate 122. For example, the RF power transistor 100 is a so-called source-down configuration such that the source terminal of the device is grounded by a connection to the substrate 122.

As shown in FIG. 2, the input match network 102 includes first and second segmented capacitor arrays 124, 126 arranged between the RF input lead and the RF power transistor 100. According to an embodiment, the first and second segmented capacitor arrays 124, 126 are semiconductor devices. The first and second segmented capacitor arrays 124, 126 include a plurality of discrete capacitors arranged next to one another in a lengthwise string. That is, the first and second segmented capacitor arrays 124, 126 are configured in a unit cell format such that a desired capacitance can be provided by connecting a number of the discrete capacitors together. Consequently, the length of the first and second segmented capacitor arrays 124, 126 determines how many discrete capacitors are available for connection, and therefore determines a maximum capacitance of a capacitor that is formed from either one of the first and second segmented capacitor arrays 124, 126.

The input match network 102 of the packaged device 101 includes first and second sets of bond wires 128, 130. The first and second sets of bond wires 128, 130 are provided by a plurality of individual bond wires that are adjacent to one another in a parallel configuration. The first set of bond wires 128 is electrically connected to the RF input lead and to the first and second segmented capacitor arrays 124, 126. However, the first set of bond wires 128 is physically disconnected from the gate terminal 106 of the RF power transistor 100. The second set of bond wires 130 is electrically connected to the gate terminal 106 and to the first and second segmented capacitor arrays 124, 126. However, the second set of bond wires 130 is physically disconnected from the RF input lead.

The transformer 104 of the input match network 102 is formed by sections of the first and second sets of bond wires 128, 130 that are interdigitated with one another. More particularly, the primary inductor 108 is formed by sections of the first set of bond wires 128 extending between the first and second segmented capacitor arrays 124, 126 and the secondary inductor 110 is formed by sections of the second set of bond wires 130 extending between the first and second segmented capacitor arrays 124, 126. The coupling coefficient of the transformer 104 is determined by a variety of physical parameters of the sections of bond wires, such as height of the wires, separation distance between the bond wires, length of the sections, etc.

According to the embodiment of FIG. 2, the first segmented capacitor array 124 includes a plurality of variable capacitors alternating with a plurality of static capacitors. The first set of bond wires 128 is electrically connected to the variable capacitors in the first segmented capacitor array 124 to form the first primary side capacitor 114, as represented in FIG. 1. Thus, the tuning capacitor 112 of the input match network 102 is formed from the variable capacitors in the first segmented capacitor array 124. Additionally, the second set of bond wires 130 is electrically connected to the static capacitors in the first segmented capacitor array 124 to form the first secondary side capacitor, 118 as represented in FIG. 1.

According to an embodiment, the second segmented capacitor 126 array is exclusively formed from static capacitors. The first set of bond wires 128 is electrically connected to the static capacitors in the second segmented capacitor 126 array to form the second primary side capacitor 116, as represented in FIG. 1. Additionally, the second set of bond wires 130 is electrically connected to the static capacitors in the second segmented capacitor 126 array to form the second secondary side capacitor 120, as represented in FIG. 1.

Figure 3:
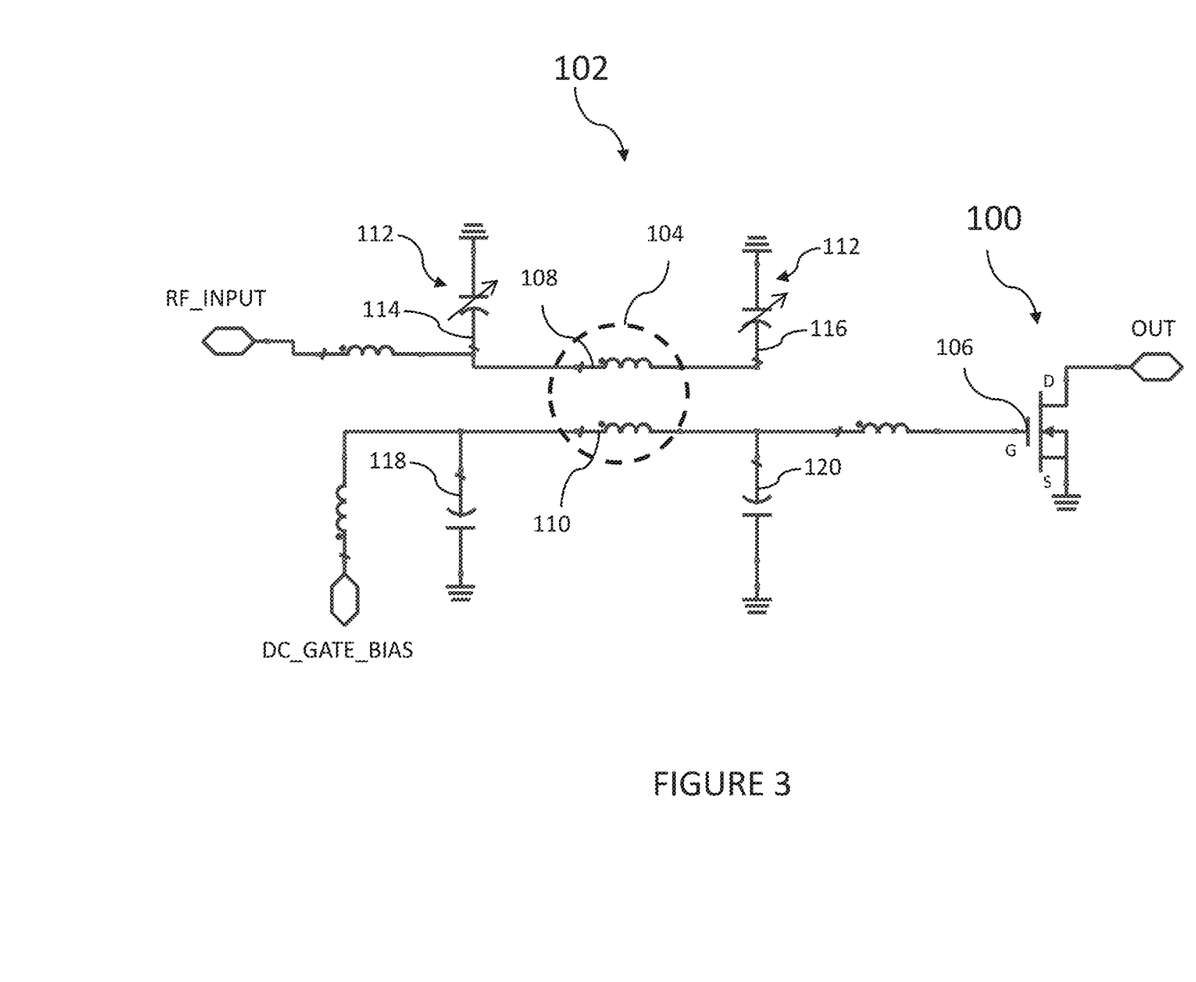
FIG. 3 illustrates an electrical schematic of a packaged RF power transistor, according to another embodiment.

FIG. 3 depicts an electrical schematic of a packaged device 101, according to another embodiment. The circuit of FIG. 3 is configured identically to the circuit of FIG. 1, with the exception that the second primary side capacitor 116 is not a static capacitor. Instead, the second primary side capacitor 116 is configured as a variable capacitor. Thus, the input match network 102 includes two tuning capacitors 112. Collectively, the tuning capacitors 112 can be used to adjust the reactance of the input match network 102 using a DC signal and therefore compensate for component variations in the manner previously discussed. Because both of the tuning capacitors 112 are connected on the primary side of the transformer 104 and are directly connected to the RF input lead via the first set of bond wires 128, a DC signal applied to the RF input lead propagates to both of the tuning capacitors 112. Thus, the circuit of FIG. 3 has a wide range of adjustable capacitance values for the input match network 102 without presenting damaging DC voltages to the gate terminal 106 of the RF power transistor 100.

The packaged device 101 of FIG. 3 can have the structural configuration depicted in FIG. 2. The two tuning capacitors 112 can be provided by configuring both the first and second segmented capacitor arrays 124, 126 with a plurality of variable capacitors alternating with a plurality of static capacitors. That is, the second segmented capacitor array 126 can be configured identically to the first capacitor segmented capacitor array 124 described with reference to FIG. 2. In this configuration, the first set of bond wires 128 is electrically connected to the variable capacitors in both the first and second segmented capacitor arrays 124, 126. The second set of bond wires 130 is electrically connected to the static capacitors in both the first and second segmented capacitor arrays 124, 126.

Figure 4:
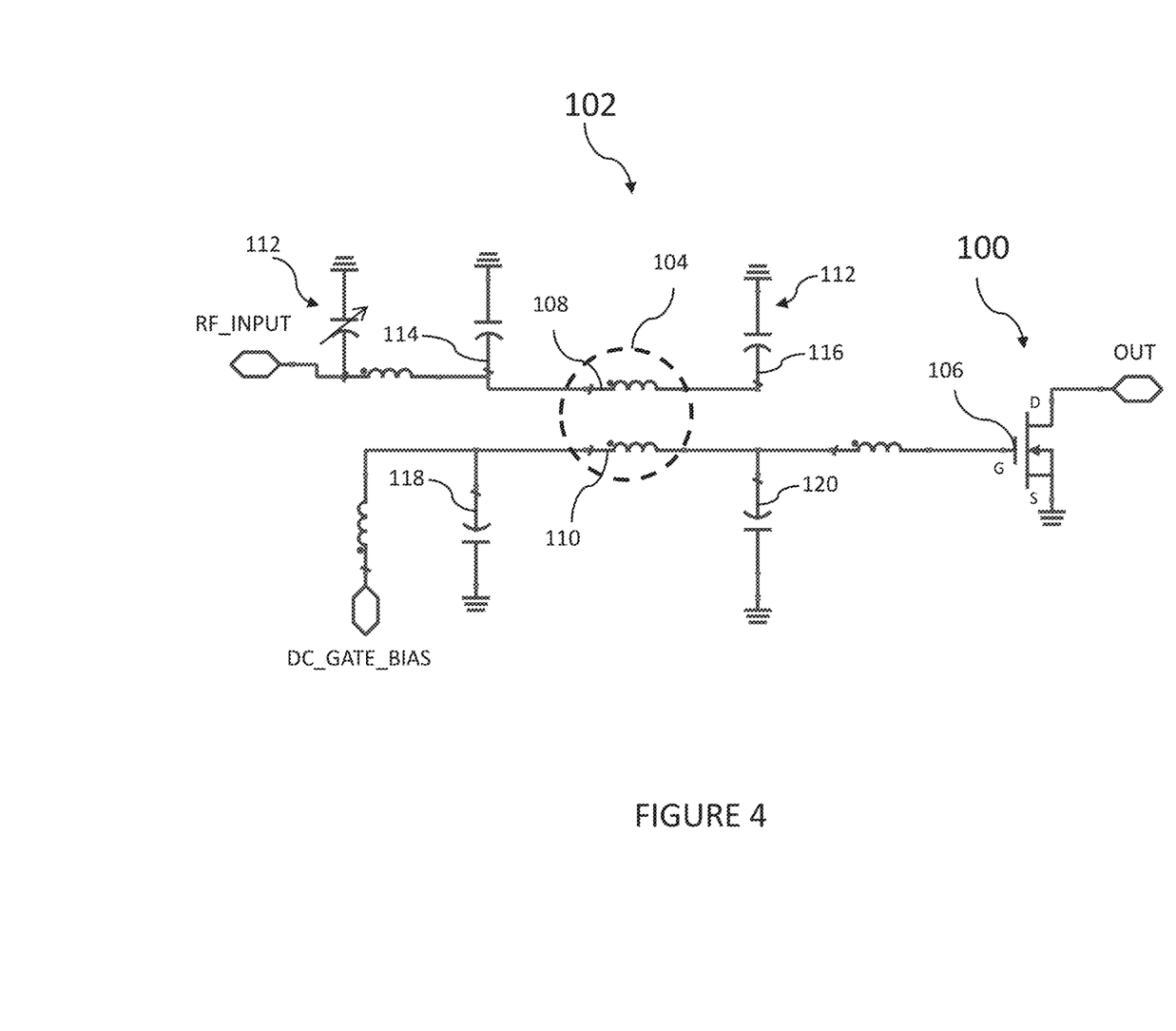
FIG. 4 illustrates an electrical schematic of a packaged RF power transistor, according to another embodiment.

FIG. 4 depicts an electrical schematic of a packaged device 101, according to another embodiment. In the embodiment of FIG. 4, the tuning capacitor 112 is separate from the first and second primary side capacitors 114, 116. In this configuration, the first and second primary side capacitors 114, 116 are static capacitors. The tuning capacitor 112 is electrically connected to the RF input lead and is on the primary side of the transformer 104 such that a DC voltage applied to the RF input lead is present at the tuning capacitor 112 but not the gate terminal 106 of the RF power transistor 100.

Figure 5:
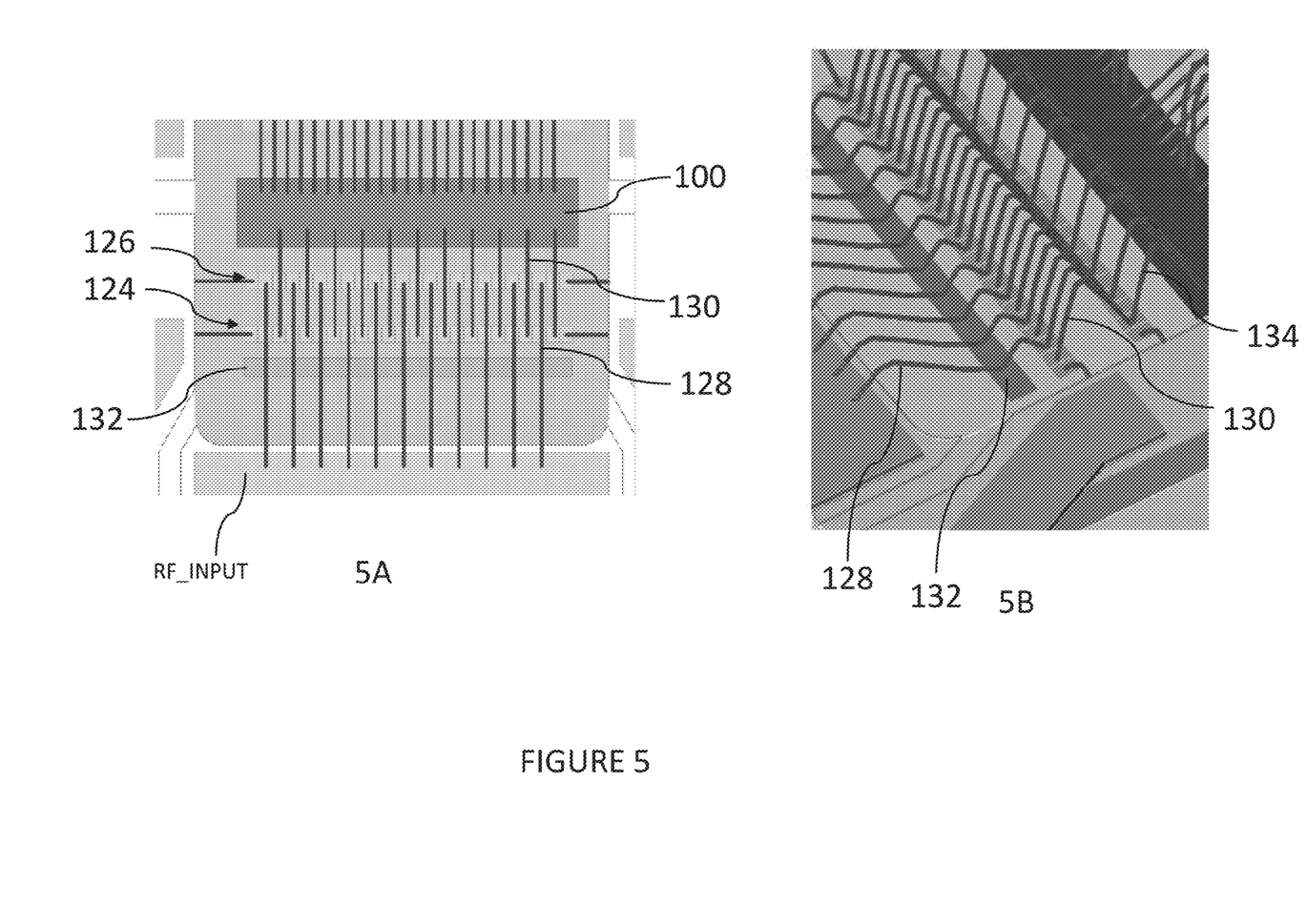
FIG. 5 illustrates a physical configuration of a packaged RF power transistor, according to an embodiment.

FIG. 5 depicts a structural configuration of the packaged device 101 that is schematically represented in FIG. 4. FIG. 5A depicts a top down view of the packaged device 101 and FIG. 5B depicts a diagonal view of the packaged device 101. In contrast to the configuration of FIG. 3, the packaged device 101 of FIG. 5 includes a third capacitor block 132. The third capacitor block 132 is arranged between the RF input lead and the first segmented capacitor array 124. The first set of bond wires 128 is electrically connected to the third capacitor block 132 as well as the first and second segmented capacitor 126 arrays 124, 126. The third capacitor block 132 is configured as a variable capacitor. Thus, the tuning capacitor 112 is formed from the variable capacitor of the third capacitor block 132. Further, in this configuration, the first and second segmented capacitor arrays 124, 126 may be formed with each of the capacitors being static capacitors.

The compensation effect of the tuning capacitor 112 will now be discussed. The packaged device 101 described herein is designed and manufactured according to nominal component values. A nominal component value is a theoretical electrical parameter that is an ideal goal of the manufacturing process. By contrast, an actual component value is an electrical parameter that is actually realized by the manufacturing process, and may deviate from the nominal component value. Thus, the process window of a particular manufacturing process describes the probability of that an actual component value (or component values) will deviate from the nominal component value (or component values). Examples of such component values that probabilistically deviate from nominal values include, but are not limited to: input capacitance of the RF power transistor 100, output capacitance of the RF power transistor 100, capacitance of the static capacitors in the input match network 102, and inductance of the bond wires in the input match network 102. These deviations occur for a variety of reasons. For example, the processing techniques that are used to form the first and second set of bond wires 128, 130 may be difficult to completely control. Accordingly, the heights of the bond wires 128, 130 are susceptible to deviation. These deviations cause the inductances of the bond wires 128, 130 to vary. Additionally, the semiconductor process that are used to form the first and second segmented capacitor 126 arrays 124, 126 and the RF power transistor 100 may be susceptible to variation. Consequently, the capacitance of the primary side capacitors 114, 116 the secondary side capacitors 118, 120 and the RF power transistor 100 can vary.

Figure 6:
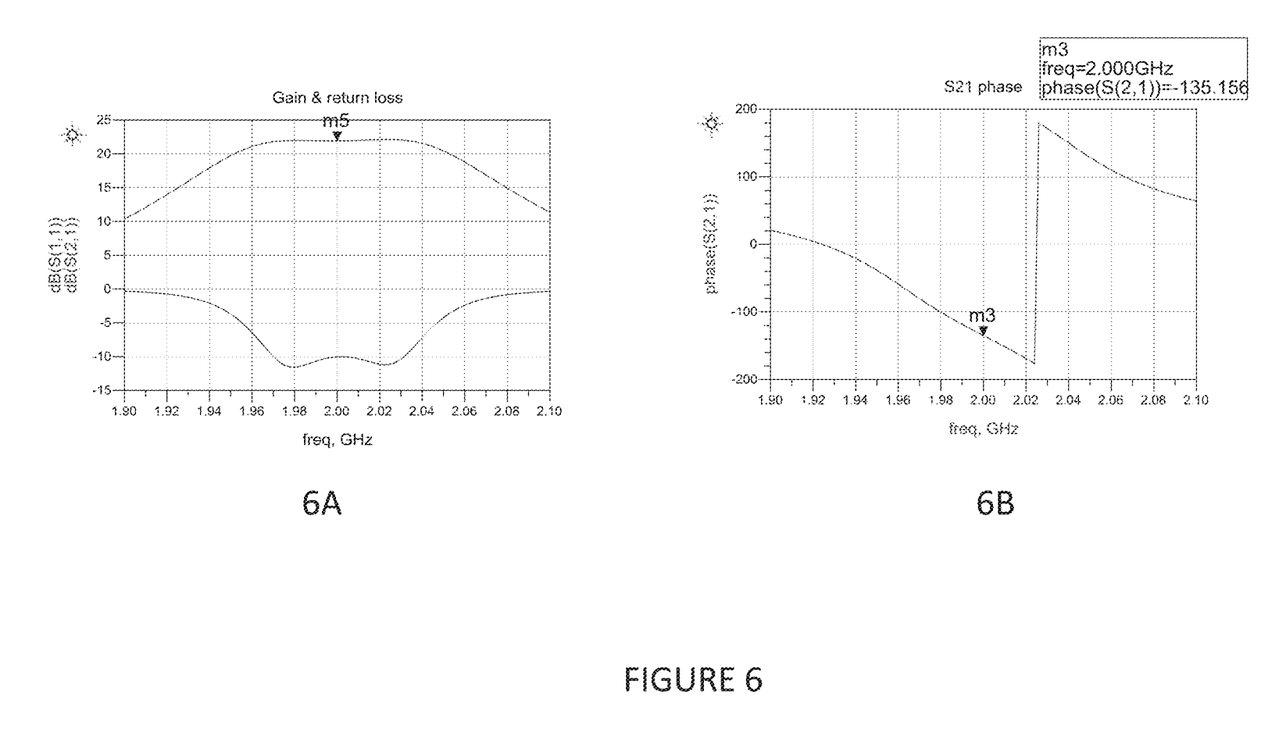
FIG. 6 illustrates a frequency response of a packaged RF power transistor with nominal component values, according to an embodiment.

Referring to FIG. 6, an exemplary nominal response of the packaged device 101 is shown. The graphs of FIG. 6 assume an input match network 102 and a PCB matching network that together transforms the input impedance of RF power transistor 100 to a 50 ohm load. The nominal component values of the RF power transistor 100 and the input match network 102 are optimized such that a maximum gain is realized at a center frequency of 2.00 GHz within a defined frequency range 1.97-2.03 GHz. Outside of this defined frequency range, the gain and efficiency of the packaged device 101 is reduced.

FIG. 6A depicts a nominal forward voltage gain (S21) of the RF packaged power transistor and a nominal input port voltage reflection coefficient (S11), according to an embodiment. FIG. 6B depicts a nominal insertion phase shift, i.e., delay, (S21) of the RF packaged power transistor.

Figure 7:
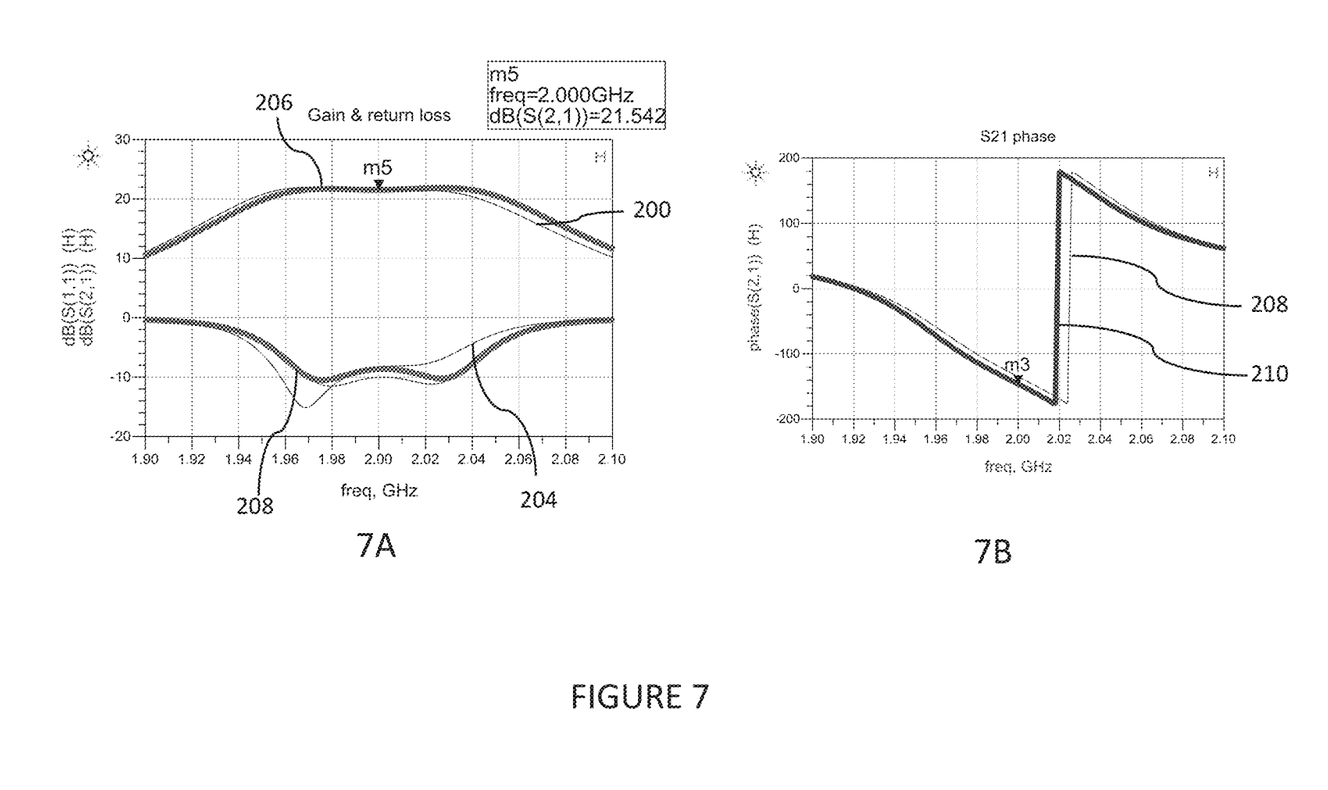
FIG. 7 illustrates a frequency response of a packaged RF power transistor with actual component values before and after compensation, according to an embodiment.

Referring to FIG. 7, which includes FIGS. 7A and 7B, exemplary actual parameters of the packaged device 101 are shown before and after compensation are shown. The actual component values of the RF power transistor 100 and the input match network 102 may deviate from the nominal characteristics by any of a variety of percentages, such as +/−1%, +/−5%, +/−10%, etc. In the example of FIG. 7, an actual input capacitance of the RF power transistor 100 is 5 percent higher than the nominal value and an inductance of a gate wire section 134 connecting the gate 106 of the RF power transistor 100 to the transformer 104 is 5 percent higher than nominal. Lines 200, 202, 204 depict the impact on the electrical parameters of the packaged device 101 due to these deviations. Lines 206, 208, 210 depict the impact on the electrical parameters of the packaged device 101 after a capacitance of the tuning capacitor 112 has been adjusted by a DC voltage applied to the RF input lead.

Referring to FIG. 7A, line 200 depicts the actual forward voltage gain (S21) of the RF packaged power transistor and line 202 depicts the actual nominal input port voltage reflection coefficient (S11) with the tuning capacitor 112 having a capacitance of 35 pF. As can be seen, these parameters are skewed due to the deviation in component values such that they are not perfectly symmetrical with respect to the center frequency of 2.00 GHz. This skewing may be unacceptable for a given application such that, in the absence of corrective measures, the part must be discarded. However, this skewing is effectively abrogated by a variation to the capacitance of the tuning capacitor 112. Line 206 depicts the actual forward voltage gain (S21) of the RF packaged power transistor and line 208 depicts the actual input port voltage reflection coefficient (S11) with the tuning capacitor 112 being adjusted downward to a capacitance of 32.7 pF. This adjustment can be made by appropriately biasing the RF Input Lead in the manner previously discussed. As can be seen, the adjustment to the capacitance of the tuning capacitor 112 fully compensates for the deviation between nominal and actual parameter values. Thus, the electrical characteristics of the packaged device 101 can be brought close to or exactly in conformity with a nominal forward voltage gain (S21) and a nominal input port voltage reflection coefficient (S11) depicted in FIG. 6A.

Referring to FIG. 7B, line 204 depicts the actual the insertion phase shift, i.e., delay, (S21) of the packaged device 101 with the tuning capacitor 112 having a capacitance of 35 pF. As can be seen, the deviation in component values results in approximately 11 degrees in phase shift between nominal and actual for the packaged device 101. This shift may be unacceptable for a given application such that, in the absence of corrective measures, the part must be discarded. Line 210 depicts the actual the insertion phase shift, i.e., delay, (S21) of the packaged device 101 after the capacitance of the tuning capacitor 112 has been adjusted to 32.7 pF in the manner discussed herein (i.e., by adjustment to a DC voltage at the RF input lead). As can be seen, this adjustment to the capacitance of the tuning capacitor 112 fully compensates for the deviation between nominal and actual parameter values. Accordingly, by adjusting the DC voltage at the RF input lead, the RF packaged power transistor can be brought close to or exactly in conformity with the nominal insertion phase shift, i.e., delay, (S21) of the packaged device 101.

FIGS. 6-7 represent one exemplary configuration of a packaged device 101 that is optimized to a particular frequency, but the compensation principle may be applied to any of a variety of component values. Further, the compensation principle may be applied to different package configurations, provided that the package includes a transformer that that isolates the tuning capacitor 112 in the manner described herein. For example, the packaged device 101 may include an output match circuit that is substantially similar or identical to the output match circuit described with reference to FIG. 9 of U.S. patent application Ser. No. 14/069,867 to Marbell.

A method of providing a packaged device 101 will now be discussed. According to an embodiment, the method includes providing a packaged device 101 according to any one of the embodiments described herein. Subsequently, the device is tested to detect a deviation between nominal component values of the RF power transistor 100 and the input match network 102 and actual component values of the RF power transistor 100 and the input match network 102. This testing process may be performed by testing the components individually. For example, the testing process may include measuring at least one of: an input capacitance of the RF power transistor 100, an output capacitance of the RF power transistor 100, a capacitance at least one of the static capacitors in the input match network 102, and an inductance of at least one of the bond wires in the input match network 102. Alternatively, the testing process may be performed on the input/output terminals of the packaged device 101. For example, the testing process may include measuring at least one of: an insertion phase shift of the packaged device 101, an actual forward voltage gain of the packaged device 101, and an input port voltage reflection coefficient.

After testing, a DC bias to be applied to the tuning capacitor 112 via the RF input lead that compensates for the deviation between nominal component values and actual component values is determined. This determination may be done experimentally (i.e., by adjusting the DC bias and measuring the response in the packaged device 101) or theoretically (i.e., by calculating an appropriate capacitance of the tuning).

Advantageously, the method disclosed herein allows for the production of a packaged device 101 at increased yield and lower expense. Because the tuning capacitor 112 is fabricated as part of the device, e.g., using segmented capacitor arrays, the time and expense required to compensate for deviations between nominal and actual values is extremely low in comparison to conventional techniques. Examples of conventional techniques for compensating for deviations between nominal and actual component values include: adjustment to bond wire loops heights after testing; and selecting components (i.e., transistors and capacitors) from nearby locations of the same wafer, which are more likely to be consistent with one another, to use in a single package. Both of these techniques are not completely effective and add expense and delay to the process. Advantageously, the method described herein eliminates the need to apply these conventional techniques because the device can be compensated simply and effectively using a DC voltage. The circuitry that drives the packaged device 101 can be designed according to commonly known techniques such that the DC voltage applied to the RF input lead is programmable and adjustable.

The term "electrically connected" describes a permanent low-ohmic connection between electrically connected elements, for example a direct contact between the concerned elements or a low-ohmic connection via a metal and/or highly doped semiconductor. The term "electrically coupled" includes that one or more intervening element(s) adapted for signal transmission may be provided between the electrically coupled elements, for example transformers and/or transistors. An electrical connection between two elements forms a node that, notwithstanding parasitic effects, remains at a constant AC and DC voltage. By contrast, when two elements are electrically coupled to one another, an AC or DC voltage may vary across the electrical coupling.

Spatially relative terms such as "under," "below," "lower," "over," "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having," "containing," "including," "comprising" and the like are open-ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A packaged RF power transistor, comprising:
an RF input lead;
a DC gate bias lead;
an RF power transistor comprising gate, source and drain terminals; and
an input match network, comprising:
   a primary inductor electrically connected to the RF input lead;
   a secondary inductor electrically connected to the gate terminal and to the DC gate bias lead;
   a tuning capacitor electrically connected to the RF input lead and physically disconnected from the gate terminal;
   first and second segmented capacitor arrays arranged between the RF input lead and the RF power transistor;
   a first set of bond wires electrically connected to the RF input lead and to the first and second segmented capacitor arrays; and
   a second set of bond wires electrically connected to the gate terminal and to the first and second segmented capacitor arrays;
wherein the input match network is configured to block DC voltages between the RF input lead and the gate terminal and to propagate AC voltages in a defined frequency range from the RF input lead to the gate terminal, wherein the tuning capacitor is configured to adjust a capacitance of the input match network based upon a variation in DC voltage applied to the RF input lead,
wherein the primary inductor is formed by sections of the first set of bond wires extending between the first and second segmented capacitor arrays, and
wherein the secondary inductor is formed by sections of the second set of bond wires extending between the first and second segmented capacitor arrays.

2. The packaged RF power transistor of claim 1, wherein the primary and secondary inductors are inductively coupled to one another in a transformer configuration, the transformer being configured to block the DC voltages and to propagate the AC voltages, and wherein the tuning capacitor is electrically connected to the primary inductor.

3. The packaged RF power transistor of claim 1, wherein the first segmented capacitor array comprises a plurality of variable capacitors alternating with a plurality of static capacitors, wherein the first set of bond wires is electrically connected to the variable capacitors in the first segmented capacitor array, wherein the second set of bond wires is electrically connected to the static capacitors in the first segmented capacitor array, and wherein the tuning capacitor is formed from the variable capacitors in the first segmented capacitor array.

4. The packaged RF power transistor of claim 3, wherein the second segmented capacitor array comprises a plurality of variable capacitors alternating with a plurality of static capacitors, wherein the first set of bond wires is electrically connected to the variable capacitors in the second segmented capacitor array, wherein the second set of bond wires is electrically connected to the static capacitors in the second segmented capacitor array, and further comprising a second tuning capacitor that is formed from the variable capacitors in the first and second segmented capacitor arrays.

5. The packaged RF power transistor of claim 1, wherein the input match network further comprises a third capacitor block arranged between the RF input lead and the RF power transistor and comprising a variable capacitor, wherein the first set of bond wires is electrically connected to the third capacitor block, and wherein the tuning capacitor comprises the variable capacitor of the third capacitor block.

6. The packaged RF power transistor of claim 5, wherein each of the capacitors in the first and second segmented arrays of capacitors are static capacitors.

7. A packaged RF power transistor of claim 1, wherein the tuning capacitor is configured to operate at a DC bias of between 0 and 40 volts, and wherein the RF power transistor is configured to operate at a DC bias of between 0 and 4 volts.

8. A packaged RF power transistor, comprising:
an RF input lead;
a DC gate bias lead;
an RF power transistor comprising gate, source and drain terminals; and
an input match network, comprising:
  a primary inductor electrically connected to the RF input lead;
  a secondary inductor electrically connected to the gate terminal and to the DC gate bias lead; and
  a tuning capacitor electrically connected to the RF input lead and physically disconnected from the gate terminal;
  first and second segmented capacitor arrays arranged between the RF input lead and the RF power transistor;
  a first set of bond wires electrically connected to the RF input lead and to the first and second segmented capacitor arrays; and
  a second set of bond wires electrically connected to the gate terminal and to the first and second segmented capacitor arrays;
wherein nominal component values of the RF power transistor and the input match network are optimized such that a maximum gain is realized at a center frequency of the defined frequency range,
wherein actual component values of the RF power transistor and the input match network deviate from the nominal component values by a percentage,
wherein a capacitance value of the tuning capacitor is adjustable based upon a variation in DC voltage applied to the RF input lead so as to compensate for the deviation between the nominal component values and the actual component values,
  wherein the primary inductor is formed by sections of the first set of bond wires extending between the first and second segmented capacitor arrays, and
  wherein the secondary inductor is formed by sections of the second set of bond wires extending between the first and second segmented capacitor arrays.

9. The packaged RF power transistor of claim 8, wherein the nominal component values of the RF power transistor and the input match network comprise at least one of: input capacitance of the RF power transistor, output capacitance of the RF power transistor, a capacitance of static capacitors in the input match network, and an inductance of bond wires in the input match network, and wherein the actual component values deviate from the nominal component values by +/−5 percent.

10. The packaged RF power transistor of claim 9, wherein the actual input capacitance of the RF power transistor is 5 percent higher than the nominal component value, wherein the inductance of one of the bond wires in the input match network is 5 percent higher than the nominal component value, wherein the deviation of the actual component values from the nominal component values shifts an insertion phase of the packaged RF power transistor by 11 percent, and wherein a capacitance value of the tuning capacitor is adjustable to completely compensate for the shift in the insertion phase.

11. A method of packaging an RF power transistor, the method comprising:
providing a packaged RF power transistor, comprising an RF input lead, a DC gate bias lead, an RF power transistor comprising gate, source and drain terminals, and an input match network, comprising:
  a transformer coupled between the RF input lead and the gate terminal configured to block DC voltages between the RF input lead and the gate terminal and to propagate AC voltages in a defined frequency range from the RF input lead to the gate terminal;
  a tuning capacitor electrically connected to the RE Input lead and physically disconnected from the gate terminal;
  first and second segmented capacitor arrays arranged between the RF input lead and the RF power transistor;
  a first set of bond wires electrically connected to the RF input lead and to the first and second segmented capacitor arrays; and
  a second set of bond wires electrically connected to the gate terminal and to the first and second segmented capacitor arrays, testing the packaged RF power transistor for a deviation between nominal component values of the RF power transistor and the input match network and actual component values of the RF power transistor and the input match network; and determining a DC bias to be applied to the tuning capacitor via the RF input lead that compensates for the deviation between nominal component values and actual component values, wherein the primary inductor is formed by sections of the first set of bond wires extending between the first and second segmented capacitor arrays, and wherein the secondary inductor is formed by sections of the second set of bond wires extending between the first and second segmented capacitor arrays.

12. The method of claim 11, wherein testing the packaged RF power transistor comprises measuring at least one of: an input capacitance of the RF power transistor, an output capacitance of the RF power transistor, a capacitance at least one of the static capacitors in the input match network, and an inductance of at least one of the bond wires in the input match network.

13. The method of claim 11, wherein testing the packaged RF power transistor comprises measuring an insertion phase of the packaged RF power transistor, and wherein determining the DC bias comprises determining a capacitance value of the tuning capacitor that will shift the insertion phase closer to a nominal insertion phase.

* * * * *

UNITED STATES PATENT AND TRADEMARK OFFICE
CERTIFICATE OF CORRECTION

PATENT NO. : 9,589,916 B2
APPLICATION NO. : 14/618305
DATED : March 7, 2017
INVENTOR(S) : M. Marbell et al.

Page 1 of 1

It is certified that error appears in the above-identified patent and that said Letters Patent is hereby corrected as shown below:

On the Title Page

(72) Inventors (Line 2), please change "E J" to -- EJ --

In the Claims

Column 11, Line 61 (Claim 8, Line 10), please change "lead; and" to -- lead; --
Column 12, Line 56 (Claim 11, Line 12), please change "RE" to -- RF --
Column 12, Line 57 (Claim 11, Line 13), please change "Input" to -- input --

Signed and Sealed this
Sixth Day of June, 2017

Michelle K. Lee
*Director of the United States Patent and Trademark Office*